United States Patent
Ohtsuki

(10) Patent No.: US 12,080,728 B2
(45) Date of Patent: Sep. 3, 2024

(54) SOLID-STATE IMAGING DEVICE

(71) Applicant: Panasonic Intellectual Property Management Co., Ltd., Osaka (JP)

(72) Inventor: Hirohisa Ohtsuki, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 17/969,411

(22) Filed: Oct. 19, 2022

(65) Prior Publication Data

US 2023/0042404 A1 Feb. 9, 2023

Related U.S. Application Data

(63) Continuation of application No. 16/803,758, filed on Feb. 27, 2020, now Pat. No. 11,508,764, which is a continuation of application No. 15/806,139, filed on Nov. 7, 2017, now Pat. No. 10,600,826, which is a continuation of application No. 14/553,586, filed on Nov. 25, 2014, now Pat. No. 9,825,072, which is a
(Continued)

(30) Foreign Application Priority Data

Jun. 27, 2012 (JP) ................. 2012-144748

(51) Int. Cl.
*H01L 27/146* (2006.01)
*H04N 25/77* (2023.01)

(52) U.S. Cl.
CPC .. *H01L 27/14603* (2013.01); *H01L 27/14643* (2013.01); *H04N 25/77* (2023.01)

(58) Field of Classification Search
CPC ........ H01L 27/14603; H01L 27/14643; H04N 25/77
See application file for complete search history.

(56) References Cited

U.S. PATENT DOCUMENTS

| 7,217,983 B2 | 5/2007 | Suzuki |
| 8,169,518 B2 | 5/2012 | Ota |
| 8,653,566 B2 | 2/2014 | Ohtsuki |

(Continued)

FOREIGN PATENT DOCUMENTS

| JP | 2005-268479 A | 9/2005 |
| JP | 2006-050403 A | 2/2006 |

(Continued)

OTHER PUBLICATIONS

International Search Report issued in PCT/JP2013/003161, dated Jul. 30, 2013, with English tranlsation.

(Continued)

*Primary Examiner* — Thanh Luu
(74) *Attorney, Agent, or Firm* — Rimon P.C.

(57) ABSTRACT

An imaging device incudes a pixel array including pixels arranged in columns and rows, one of the columns including a first pixel in a first row and a second pixel in a second row; a first signal line, to which the first pixel is coupled, and a second signal line, to which the second pixel is coupled, extending in a column direction of the pixels; and a first shield line, to which the first pixel is coupled, extending in the column direction. The first signal line, the first shield line, and the second signal line are arranged along a row direction of the pixels in that order.

22 Claims, 17 Drawing Sheets

Related U.S. Application Data continuation of application No. PCT/JP2013/003161, filed on May 17, 2013.

(56) References Cited

U.S. PATENT DOCUMENTS

| | | | |
|---|---|---|---|
| 8,659,688 | B2 | 2/2014 | Wakano et al. |
| 8,704,924 | B2 | 4/2014 | Watanabe et al. |
| 10,600,826 | B2 | 3/2020 | Ohtsuki |
| 2005/0205901 | A1 | 9/2005 | Suzuki |
| 2008/0225148 | A1 | 9/2008 | Parks |
| 2008/0230123 | A1 | 9/2008 | Mitsui et al. |
| 2009/0046185 | A1 | 2/2009 | Ota |
| 2010/0060764 | A1* | 3/2010 | McCarten ......... H01L 27/14636 348/308 |
| 2010/0097486 | A1 | 4/2010 | Iwane |
| 2011/0080492 | A1 | 4/2011 | Matsuda et al. |
| 2011/0128400 | A1 | 6/2011 | Wakano et al. |
| 2011/0216212 | A1 | 9/2011 | Watanabe et al. |
| 2012/0181589 | A1 | 7/2012 | Zhu et al. |
| 2012/0188424 | A1 | 7/2012 | Li |
| 2013/0001650 | A1 | 1/2013 | Ohtsuki |
| 2013/0113060 | A1 | 5/2013 | Matsunaga |
| 2013/0182163 | A1* | 7/2013 | Kobayashi ........ H01L 27/14645 348/302 |
| 2014/0118593 | A1 | 5/2014 | Wakano et al. |

FOREIGN PATENT DOCUMENTS

| | | |
|---|---|---|
| JP | 2009-049525 A | 3/2009 |
| JP | 2011-114324 A | 6/2011 |
| JP | 2011-187544 A | 9/2011 |
| JP | 2011-199185 A | 10/2011 |
| WO | 2012/005014 A1 | 1/2012 |

OTHER PUBLICATIONS

Non-Final Office Action issued in U.S. Appl. No. 14/553,586, dated May 9, 2016.
Final Office Action issued in U.S. Appl. No. 14/553,586, dated Sep. 2, 2016.
Non-Final Office Action issued in U.S. Appl. No. 14/553,586, dated Jan. 19, 2017.
Final Office Action issued in U.S. Appl. No. 14/553,586, dated May 9, 2017.
Notice of Allowance issued in U.S. Appl. No. 14/553,586, dated Aug. 31, 2017.
Non-Final Office Action issued in U.S. Appl. No. 15/806,139, dated Jul. 3, 2019.
Notice of Allowance issued in U.S. Appl. No. 15/806,139, dated Nov. 14, 2019.
Non-Final Office Action issued in U.S. Appl. No. 16/803,758, dated Jun. 25, 2021.
Final Office Action issued in U.S. Appl. No. 16/803,758, dated Nov. 8, 2021.
Non-Final Office Action issued in U.S. Appl. No. 16/803,758, dated Feb. 24, 2022.
Final Office Action issued in U.S. Appl. No. 16/803,758, dated May 3, 2022.
Notice of Allowance issued in U.S. Appl. No. 16/803,758, dated Aug. 12, 2022.

* cited by examiner

SOLID-STATE IMAGING DEVICE

CROSS REFERENCE TO RELATED APPLICATIONS

This application is a continuation of U.S. patent application Ser. No. 16/803,758, filed on Feb. 27, 2020, which is a continuation of U.S. patent application Ser. No. 15/806,139, filed on Nov. 7, 2017, now U.S. Pat. No. 10,600,826, which is a continuation of U.S. patent application Ser. No. 14/553,586 filed Nov. 25, 2014, now U.S. Pat. No. 9,825,072, which is a continuation application of PCT International Application No. PCT/JP2013/003161 filed on May 17, 2013, designating the United States of America, which is based on and claims priority of Japanese Patent Application No. 2012-144748 filed on Jun. 27, 2012. The entire disclosures of the above-identified applications, including the specifications, drawings and claims are incorporated herein by reference in their entirety.

FIELD

One or more exemplary embodiments disclosed herein relate generally to solid-state imaging devices, and particularly relate to a pixel circuit layout adaptable to an increase in the number of pixels.

BACKGROUND

In recent years, many imaging devices capable of capturing images with a wide dynamic range have been proposed. Hereinafter, a solid-state imaging device including a photoelectric conversion film is described with reference to Patent Literature (PTL) 1 (Japanese Unexamined Patent Application Publication No. 2009-49525).

FIG. 16 illustrates a cross-sectional view of a pixel array in a solid-state imaging device including a photoelectric conversion film disclosed in PTL 1. FIG. 17 illustrates a schematic circuit diagram of the pixel array disclosed in PTL 1. As shown in FIG. 16 and FIG. 17, light collected by a lens 502 passes through a color filter 503 that is transmissive to specific wavelengths, and produces holes in the photoelectric conversion film 505. The holes produced in the photoelectric conversion film 505 are absorbed into a pixel electrode 506 due to an electric field applied between an upper transparent electrode 504 and a lower pixel electrode 506 disposed on opposite sides of the photoelectric conversion film 505. The holes absorbed into the pixel electrode 506 are converted to voltage information, and the voltage information is provided to a signal line SIG via a floating diffusion (FD) 520 and an amplifier circuit (SF) 507.

SUMMARY

Technical Problem

However, the structure of the solid-state imaging device 500 disclosed in PTL 1 has a problem in that a reduction in pixel pitch for increasing the number of pixels leads to a lower frame rate caused by an increase in the number of pixels to be read out. Furthermore, the reduction in pixel pitch results in an increase in cross-talk because the distances between lines in pixels are shortened. In order to maintain signal integrity, the frame rate must be reduced as the cross-talk increases.

Solution to Problem

In order to solve the aforementioned problem, an imaging device according to one aspect disclosed herein includes a pixel array including pixels arranged in columns and rows, one of the columns including a first pixel in a first row and a second pixel in a second row; a first signal line, to which the first pixel is coupled, and a second signal line, to which the second pixel is coupled, extending in a column direction of the pixels; and a first shield line, to which the first pixel is coupled, extending in the column direction. The first signal line, the first shield line, and the second signal line are arranged along a row direction of the pixels in that order.

Additional benefits and advantages of the disclosed embodiments will be apparent from the Specification and Drawings. The benefits and/or advantages may be individually obtained by the various embodiments and features of the Specification and Drawings, which need not all be provided in order to obtain one or more of such benefits and/or advantages.

BRIEF DESCRIPTION OF DRAWINGS

These and other advantages and features will become apparent from the following description thereof taken in conjunction with the accompanying Drawings, by way of non-limiting examples of embodiments disclosed herein.

DESCRIPTION OF EMBODIMENTS

Hereinafter, certain exemplary embodiments are described in greater detail with reference to the accompanying Drawings.

Embodiment 1

A solid-state imaging device according to Embodiment 1 includes two signal lines for each pixel column to increase a frame rate and prevent cross-talk. With this, it is possible to prevent a decrease in frame rate even when the number of pixels to be read out increases due to a reduction of pixel pitch for increasing the number of pixels.

Figure 1:
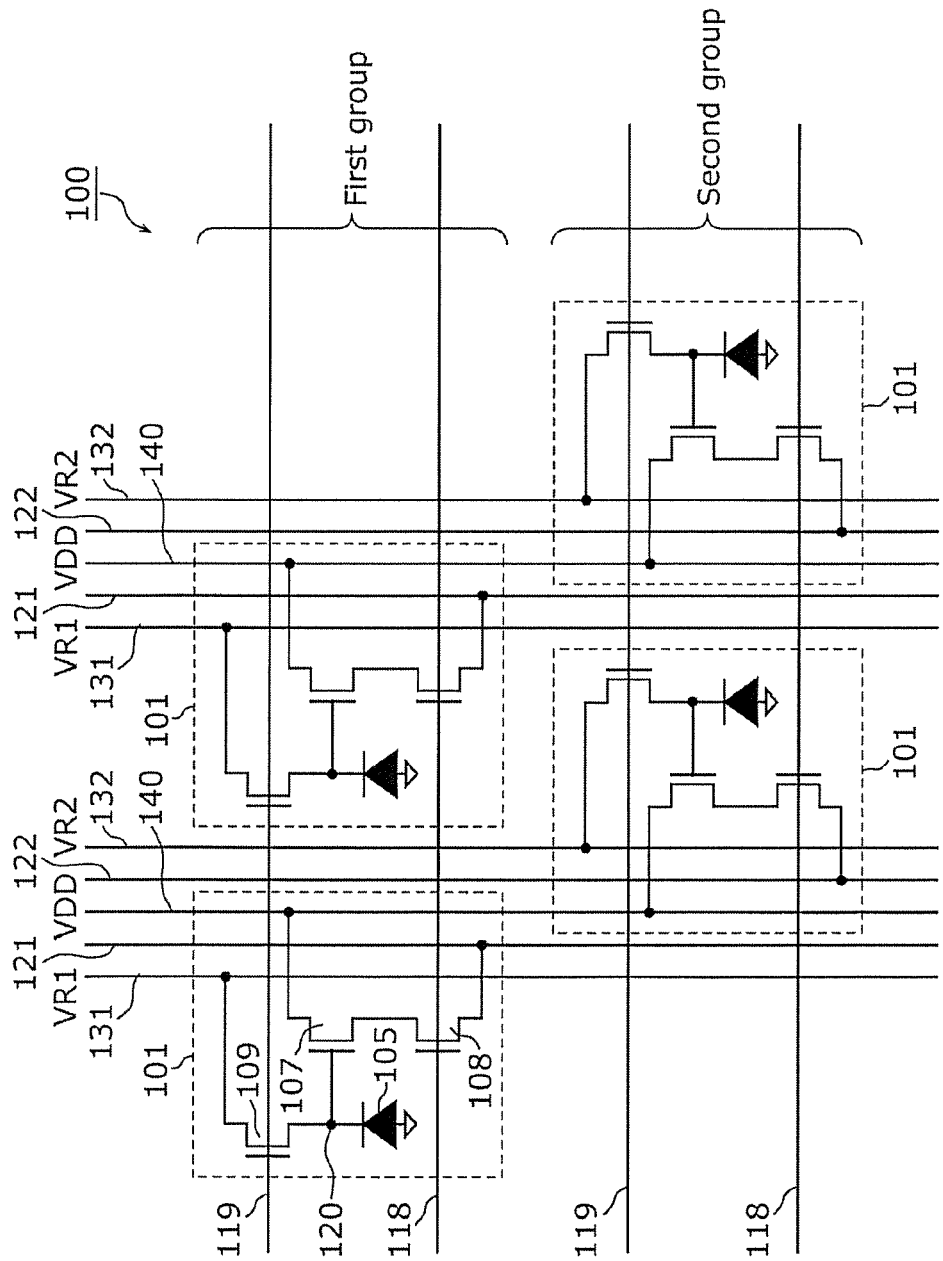
FIG. 1 illustrates a schematic circuit diagram showing a pixel array in a solid-state imaging device according to Embodiment 1.
Figure 2:
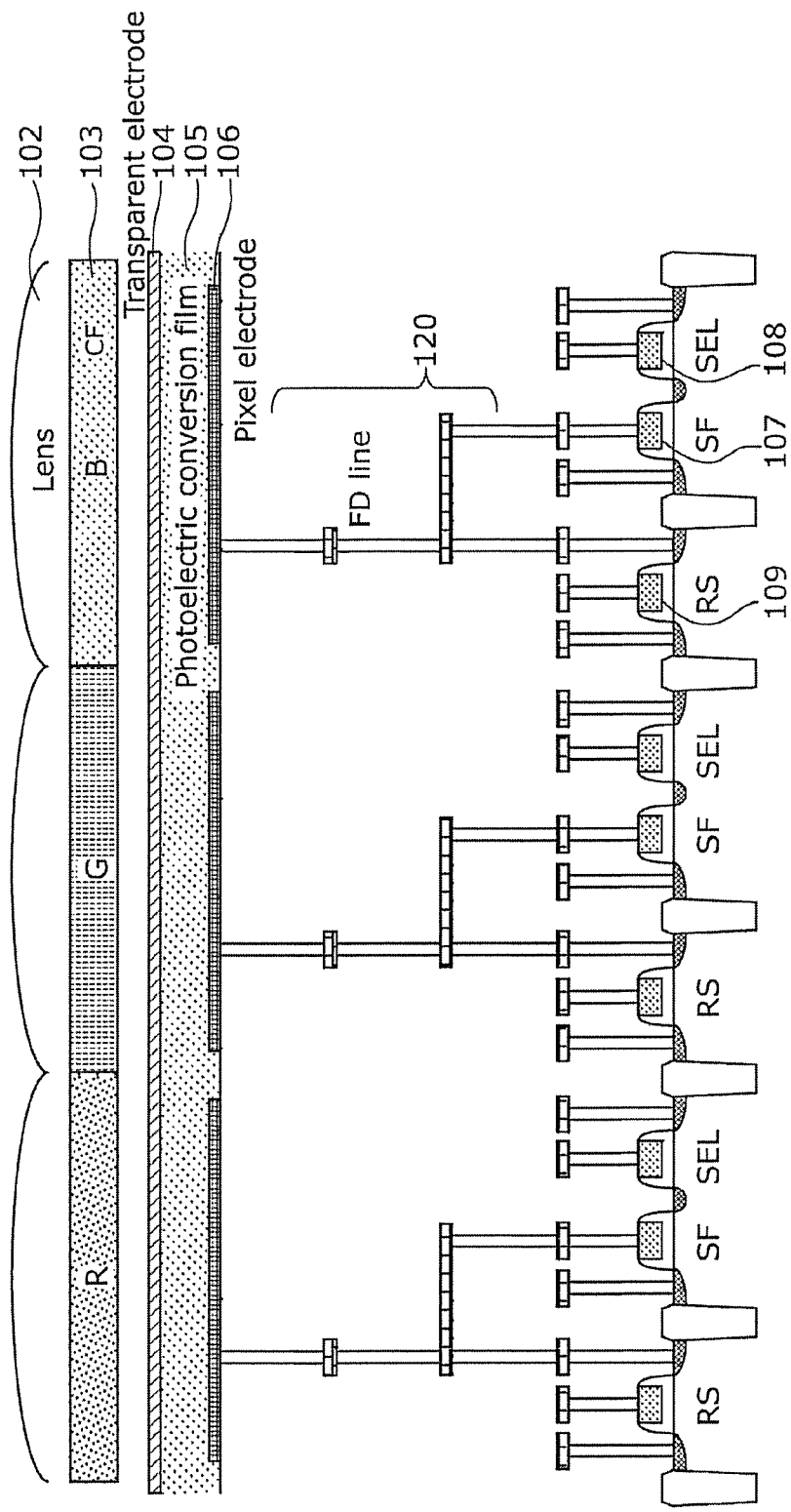
FIG. 2 illustrates a sectional view of the pixel array in the solid-state imaging device according to Embodiment 1.

FIG. 1 illustrates a schematic circuit diagram showing a pixel array in the solid-state imaging device according to Embodiment 1. FIG. 2 illustrates a sectional view of the pixel array in the solid-state imaging device according to Embodiment 1. The pixel array 100 shown in FIG. 1 includes pixels 101 arranged in columns and rows and signal lines 121 and 122. The signal line 121 is a first signal line which is provided for each column and conveys a pixel signal. The signal line 122 is a second signal line which is provided for each column and conveys a pixel signal. The pixel 101 belongs to a first group or a second group on a row-by-row basis. In other words, the foregoing signal line structure makes it possible to simultaneously read out the pixel signals of the pixel 101 belonging to the first group and the pixel 101 belonging to the second group which are adjacent to each other. With this, it is possible to prevent a decrease in frame rate caused by signal transmission delay when the number of pixels is increased.

As shown in FIG. 2, the pixel (unit cell) 101 includes a lens 102, a color filter 103, a transparent electrode 104, a photoelectric conversion film 105, a pixel electrode 106, an amplifier transistor (SF) 107, a selection transistor (SEL) 108, and a reset transistor (RS) 109. The lens 102 collects light. The color filter 103 is disposed below the lens 102 and is transmissive to specific wavelengths. The transparent electrode 104 is disposed below the color filter 103 and allows incident light to pass through the transparent electrode 104 downwardly. The photoelectric conversion film 105 is disposed below the transparent electrode 104 and converts the incident light coming from above into signal charge (holes). The pixel electrode 106 is disposed below the photoelectric conversion film 105 and collects the signal charge from the photoelectric conversion film 105 by applying an electric field between the transparent electrode 104 and the pixel electrode 106. The amplifier transistor (SF) 107 is connected to the pixel electrode 106 and provides a signal proportional to the holes collected in the pixel electrode 106. The selection transistor (SEL) 108 sequentially selects the pixel 101 in the pixel array 100 on a row-by-row basis to pass the output of the amplifier transistor 107 to the signal line. The reset transistor (RS) 109 resets the voltage of the pixel electrode 106

As shown in FIG. 1, the selection transistor 108 in the pixel 101 belonging to the first group has the source connected to the signal line 121, the drain connected to the source of the amplifier transistor 107, and the gate connected to a scan line 118. The selection transistor 108 belonging to the first group is a first selection transistor that provides a voltage provided from the amplifier transistor 107 to the signal line 121 by receiving a row selection signal at the gate of the first selection transistor.

The reset transistor 109 belonging to the first group has the drain connected to a reset voltage line 131, the source connected to the amplifier transistor 107, and the gate connected to the scan line 119, and applies a reset voltage to a FD line 120.

The amplifier transistor 107 has the drain connected to a power line 140 and the gate connected to the FD line 120, and provides a voltage according to the signal charge.

The pixel electrode 106 disposed on one side of the photoelectric conversion film 105 is connected to the gate of the amplifier transistor 107 and the source of the reset transistor 109 via the FD line 120. The FD line 120 is a floating diffusion line which is connected to the pixel electrode 106 and accumulates the signal charge.

Similarly, the selection transistor 108 in the pixel 101 belonging to the second group has the source connected to the signal line 122, the drain connected to the source of the amplifier transistor 107, and the gate connected to the scan line 118. The selection transistor 108 belonging to the second group is a second selection transistor that provides a voltage provided from the amplifier transistor 107 to the signal line 122 by receiving the row selection signal at the gate of the second selection transistor 108.

The reset transistor 109 belonging to the second group has the drain connected to a reset voltage line 132, the source connected to the amplifier transistor 107, and the gate connected to the scan line 119, and applies a reset voltage to the FD line 120.

The operation of the pixel array 100 including the pixels 101 arranged as described above is described with reference to FIG. 3.

Figure 3:
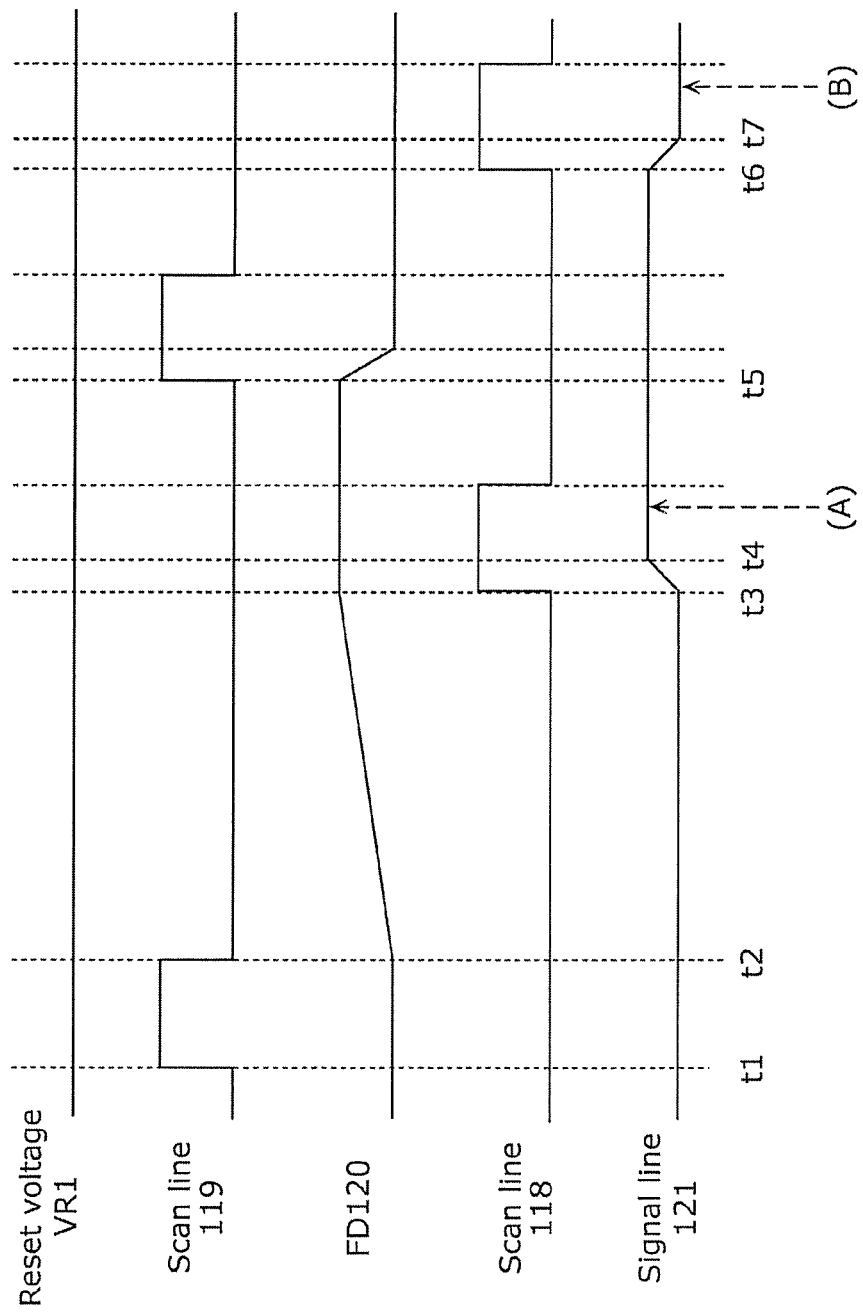
FIG. 3 illustrates a timing diagram of the pixel array according to Embodiment 1.

FIG. 3 illustrates a timing diagram of the pixel array according to Embodiment 1.

Firstly, when light is received, the light collected by the lens 102 passes through the color filter 103 (for example, red (R), blue (B), and green (G)) that is transmissive to specific wavelengths, and the passed light reaches the photoelectric conversion film 105. The photoelectric conversion film 105 converts the reached light into hole charge ΔQ according to the amount of the reached light.

Then, at time t1, the scan line 119 is set to a HIGH level to turn on the reset transistor 109, thereby resetting the voltage of the FD line 120 to a reset voltage VR1.

Next, at time t2, the scan line 119 is set to a LOW level by applying a voltage (for example, 10V) to the transparent electrode 104, so that the hole charge produced in the photoelectric conversion film 105 is absorbed into the pixel electrode 106 due to the electric field. In this way, the voltage ΔV of the FD line 120 is increased by the holes absorbed into the pixel electrode 106, thereby activating the amplifier transistor 107. It is to be noted that the relation between the hole charge ΔQ and the voltage ΔV of the FD line 120 is represented as ΔV=ΔQ/C1 using a parasitic capacitance of the FD line 120.

Next, at time t3, the scan line 118 is set to a HIGH level to turn on the selection transistor 108, thereby passing the signal provided from the amplifier transistor 107 to the signal line 121.

Next, after time t4 at which a predetermined time has passed from time t3, the voltage (A) of the signal line 121 is recorded on a read-out circuit connected downstream of the pixel array.

Next, at time t5, the reset transistor 109 is turned on to reset the FD line 120 again.

Next, at time t6, the selection transistor 108 is turned on to select the same row, and after time t7 at which a predetermined time has passed from time t6, the voltage (B) of the signal line 121 is recorded on the read-out circuit. Then, the read-out circuit provides a difference between the voltages (A) and (B) of the signal line 121 as data.

Furthermore, at each of the above times t1 to t7, a pixel 101 in the second row also performs the same operation as the pixel 101 in the first row, and data is provided.

In this case, for example, when there is a parasitic capacitance between the FD line 120 belonging to the first row and the signal line 122 connected to the second row, the FD line 120 and the signal line 122 suffer from cross-talk because, while the FD line 120 is active, the signal line 122 is also active.

For this reason, in order to simultaneously read out data from two rows, it is necessary to reduce the parasitic capacitance between the FD line 120 belonging to the first row and the signal line 122 and the parasitic capacitance between the FD line 120 belonging to the second row and the signal line 121. Furthermore, in order to eliminate a difference between the rows, the layouts of the first row and the second row must be the same. Hereinafter, the layout of the pixel array 100 included in the solid-state imaging device according to Embodiment 1 is described in detail. It is to be noted that the pixel array 100 has a multi-layer structure, and thus it is difficult to illustrate the layout in one top perspective view. Accordingly, the multi-layer structure is separately shown in FIG. 4 to FIG. 9. Furthermore, the layout diagrams of FIG. 4 to FIG. 9 correspond to the lower layer to the upper layer in this order. Furthermore, in FIG. 4 to FIG. 9, in order from the lower layer to the upper layer, a diffusion region layer (source-drain layer), a gate layer, a first wiring layer, a second wiring layer, a third wiring layer, and a pixel electrode layer are shown.

Figure 4:
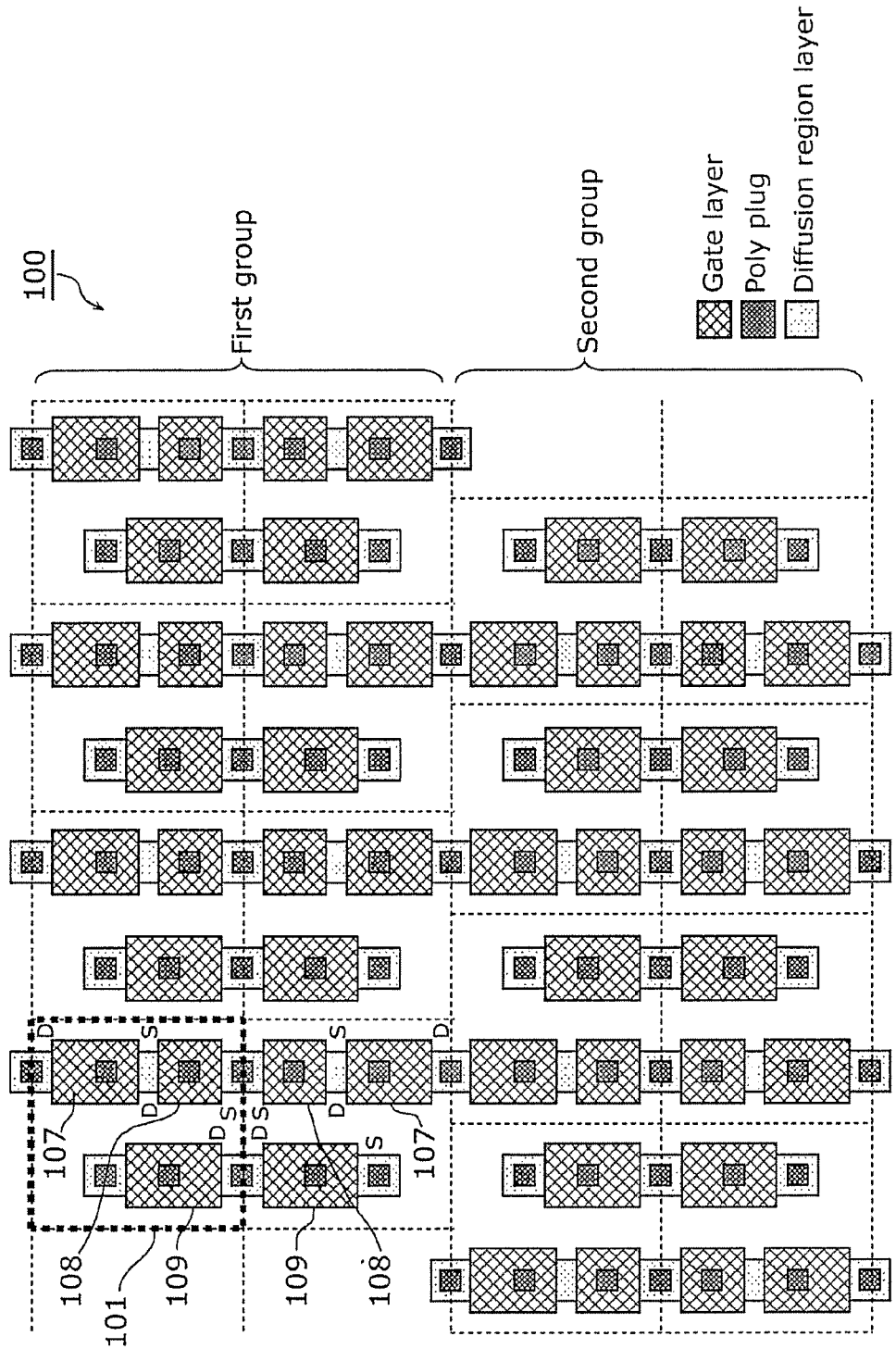
FIG. 4 illustrates a first planar layout of the pixel array according to Embodiment 1.

FIG. 4 illustrates a first planar layout of the pixel array according to Embodiment 1. In FIG. 4, a two-dimensional arrangement of pixels 101 each of which includes the amplifier transistor 107, the selection transistor 108, and the reset transistor 109 is shown. The pixels 101 are classified into the first group in which data is provided to the signal line 121 and the second group in which data is provided to the signal line 122. The first group including one or more adjacent lines and the second group including one or more adjacent lines are alternated from an upper row to a lower row. It is to be noted that the layout of the pixel array 100 shown in FIG. 1 is an exemplary layout in which the first group and the second group are alternated every other row, but the layout of the pixel array 100 shown in FIG. 4 to FIG. 9 is an exemplary layout in which the first group and the second group are alternated every two adjacent rows. In this way, a line layout is changed not every other row but every two rows, and thus the line layout of the pixel array is simplified.

In FIG. 4, the amplifier transistor 107 and the selection transistor 108 included in the pixel 101 are connected in series. Furthermore, the drain of the amplifier transistor 107, the source of the selection transistor 108, and the drain of the reset transistor 109 share a diffusion region with the drain of the amplifier transistor 107, the source of the selection transistor 108, and the drain of the reset transistor 109 in the adjacent pixel 101 in the upper or lower row, respectively. In other words, the diffusion region of the source of the selection transistor 108 is shared between pixels belonging to adjacent rows in the same group, and the diffusion region of the drain of the amplifier transistor 107 is shared between adjacent pixels across a boundary between the first group and the second group. In this way, the pixel array is miniaturized. Accordingly, it is possible to adapt to a reduction in pixel pitch for increasing the number of pixels.

The amplifier transistor 107 and the selection transistor 108 in each row are disposed in a line. Furthermore, the reset transistor 109 in the first group is disposed to the left of the selection transistor 108 in the same pixel, and the reset transistor 109 in the second group is disposed to the right of the selection transistor 108 in the same pixel. In other words, the reset transistor 109 in the pixel 101 belonging to the first group is disposed to the right of a line connecting the amplifier transistor 107 and the selection transistor 108 in the pixel 101 belonging to the first group when viewed from a predetermined direction perpendicular to a light receiving face of the pixel array 100. On the other hand, the reset transistor 109 in the pixel belonging to the second group is disposed to the left of a line connecting the amplifier transistor 107 and the selection transistor 108 in the pixel 101 belonging to the second group when viewed from the predetermined direction. In this way, the FD line 120 in the first group and the signal line 122 can be spaced apart from each other, and the FD line 120 in the second group and the signal line 121 can be spaced apart from each other. Accordingly, cross-talk can be prevented effectively.

Figure 5:
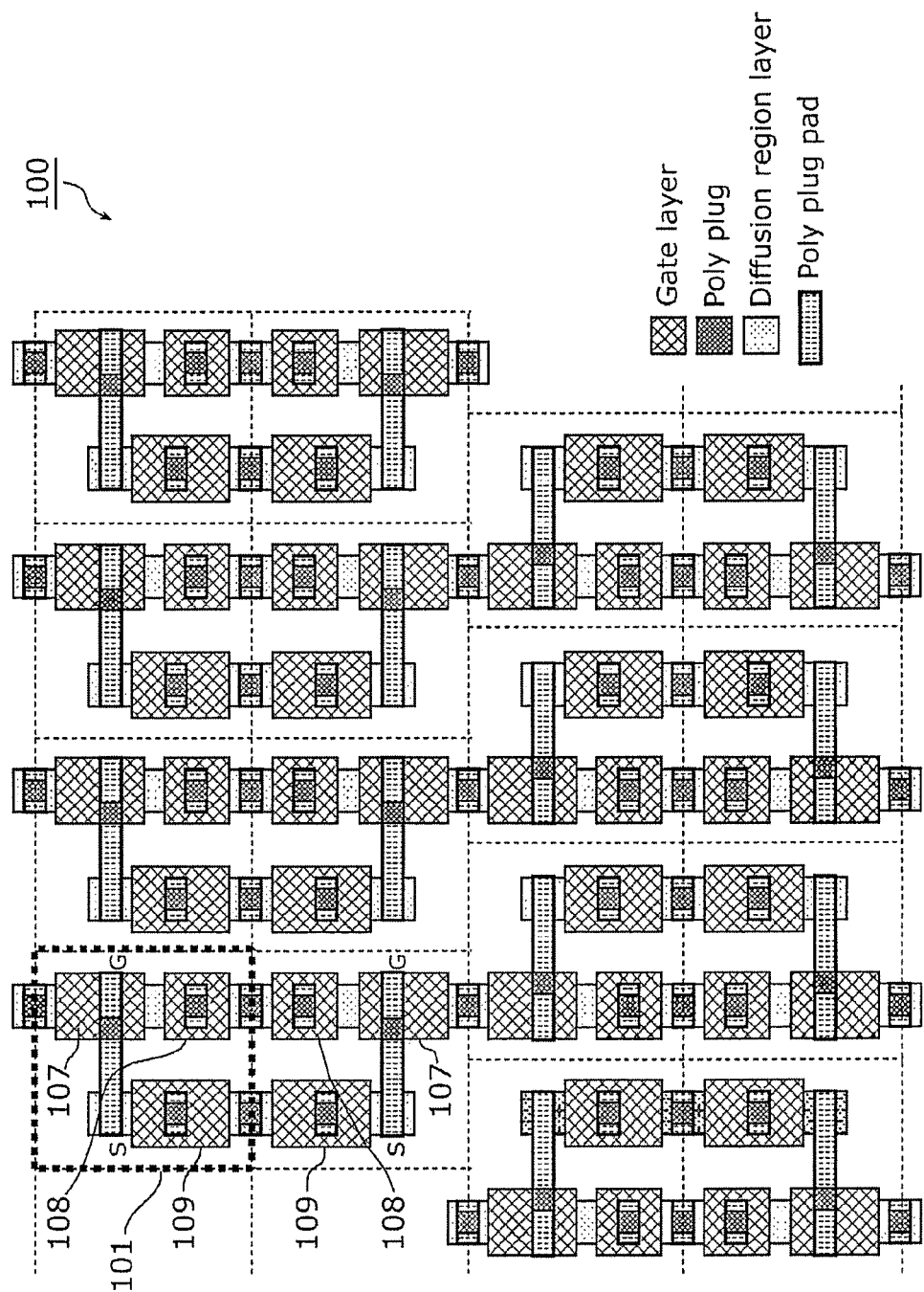
FIG. 5 illustrates a second planar layout of the pixel array according to Embodiment 1.

FIG. 5 illustrates a second planar layout of the pixel array according to Embodiment 1. In the layout of FIG. 5, poly plugs and poly plug pads are added to the layout of FIG. 4. As shown in FIG. 5, the source of the reset transistor 109 and the gate of the amplifier transistor 107 are connected via the poly plug and the poly plug pad.

Figure 6:
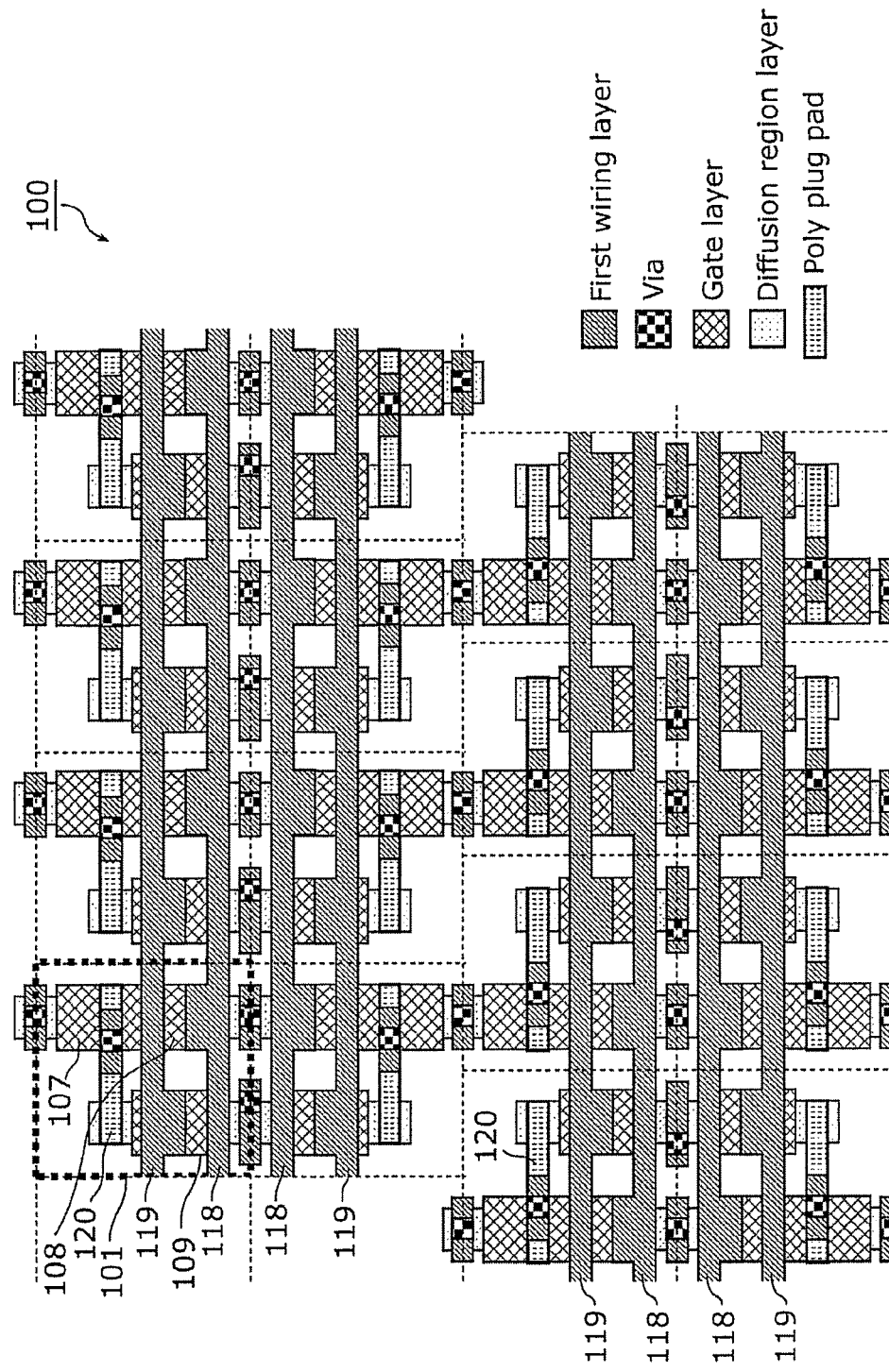
FIG. 6 illustrates a third planar layout of the pixel array according to Embodiment 1.

FIG. 6 illustrates a third planar layout of the pixel array according to Embodiment 1. In the layout of FIG. 6, the first wiring layer and vias connecting the first wiring layer and the second wiring layer are added to the layout of FIG. 5. As shown in FIG. 6, the scan lines 118 and 119 for selecting the pixels 101 to be read out are laterally disposed in the first wiring layer.

Figure 7:
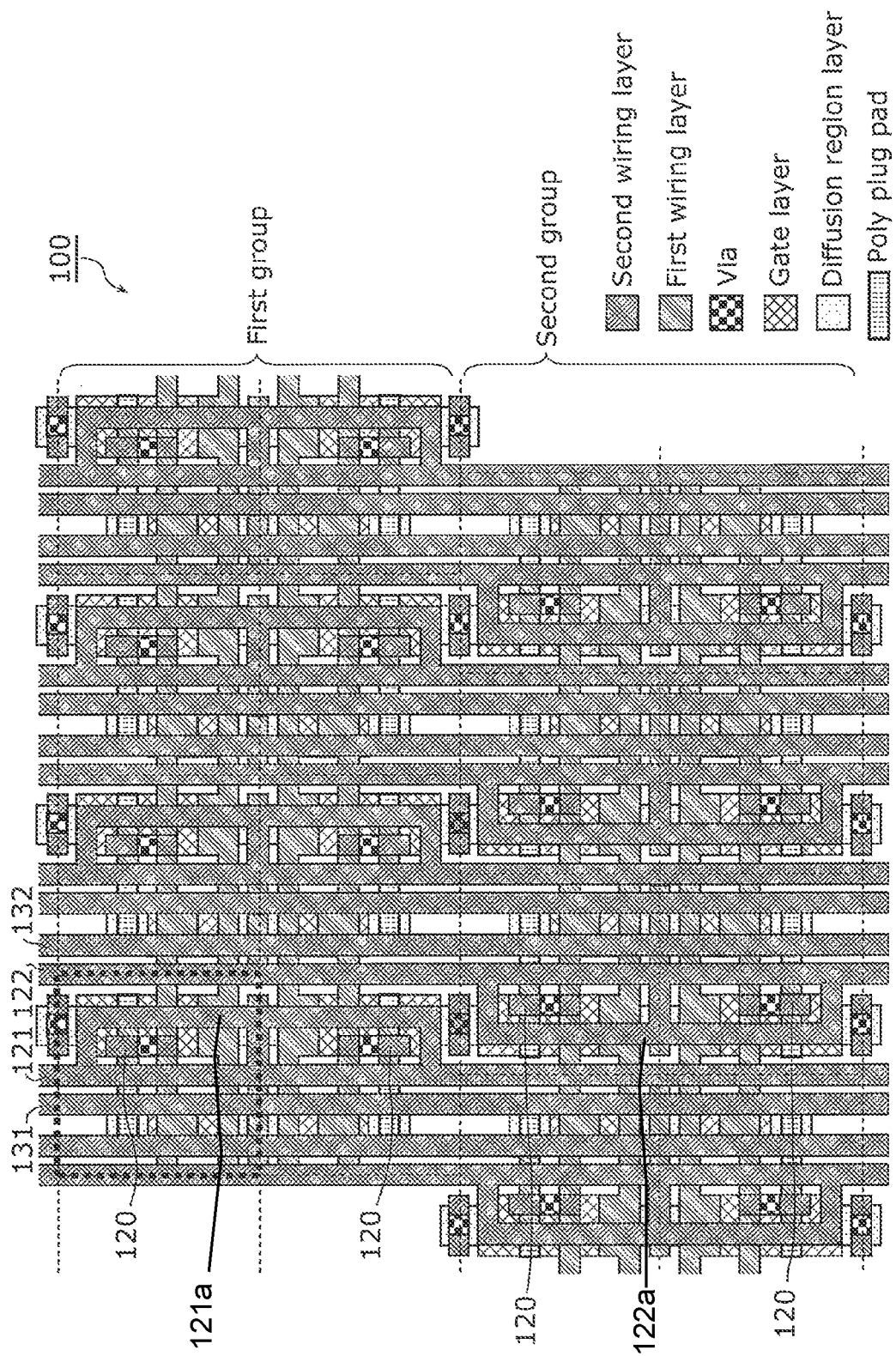
FIG. 7 illustrates a fourth planar layout of the pixel array according to Embodiment 1.

FIG. 7 illustrates a fourth planar layout of the pixel array according to Embodiment 1. In the layout of FIG. 7, the second wiring layer and vias connecting the second wiring layer and the third wiring layer are added to the layout of FIG. 6. As shown in FIG. 7, the signal lines 121 and 122 and the reset voltage lines 131 and 132 are longitudinally disposed in the second wiring layer.

In this layer, the FD line 120 in the first group is surrounded by a first signal branch line 121a of the signal line 121. Due to this arrangement, the FD line 120 in the first group does not suffer from the cross-talk from the signal line 122. Similarly, the FD line 120 in the second group is surrounded by a second signal branch line 122a of the signal line 122, and thus does not suffer from the cross-talk from the signal line 121. In other words, the signal line 121 serves as a first shield line disposed between the FD line 120 in the pixel 101 belonging to the first group and the signal line 122, and the signal line 122 serves as a second shield line disposed between the FD line 120 in the pixel 101 belonging to the second group and the signal line 121. Furthermore, the signal line 121 and the signal line 122 are disposed along each column of the pixels in the second wiring layer which is the same one of a plurality of the wiring layers.

Figure 8:
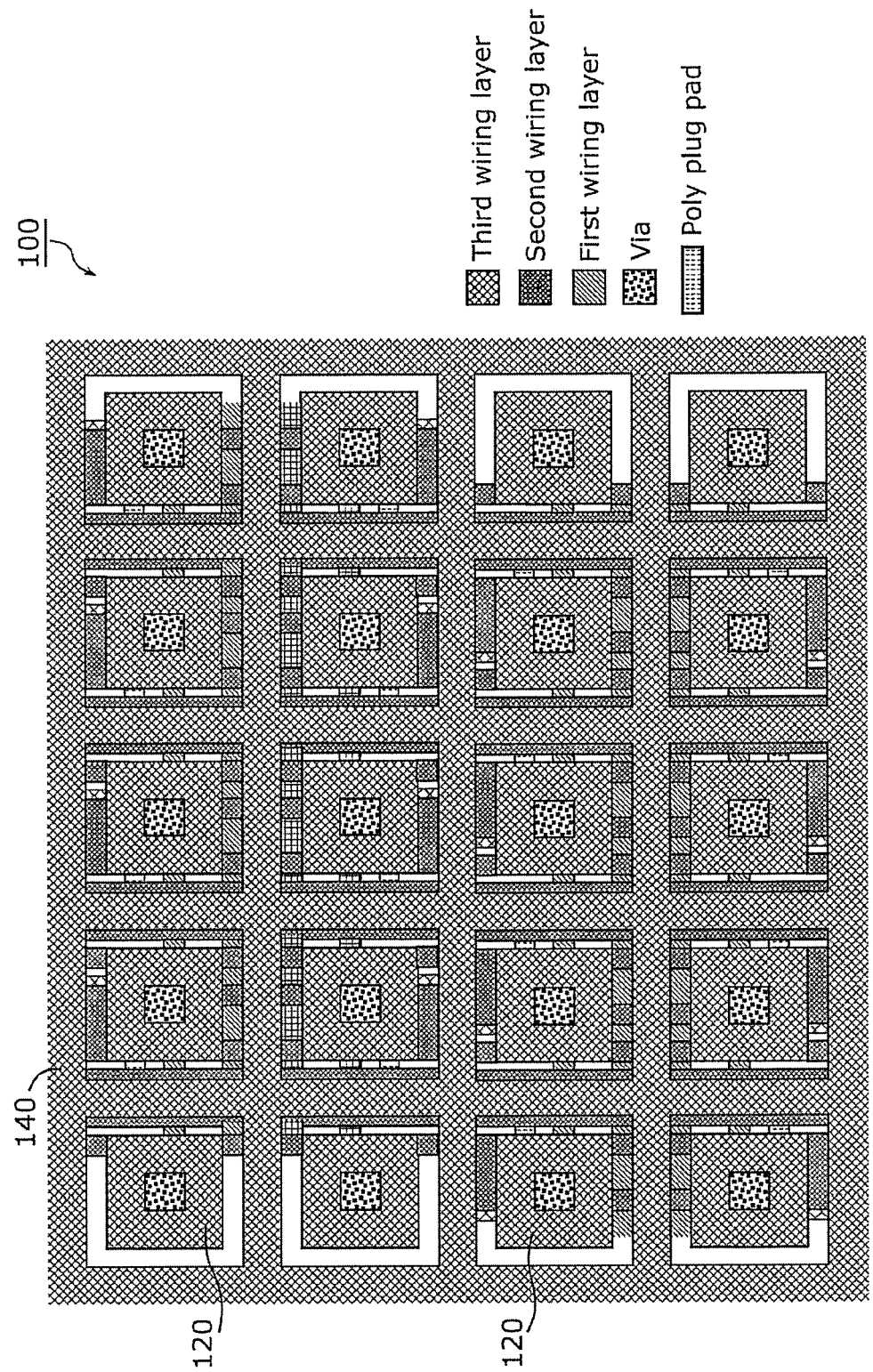
FIG. 8 illustrates a fifth planar layout of the pixel array according to Embodiment 1.

FIG. 8 illustrates a fifth planar layout of the pixel array according to Embodiment 1. In the layout of FIG. 8, the third wiring layer and vias connecting the third wiring layer and the pixel electrodes 106 are added to the layout of FIG. 7. As shown in FIG. 8, in the third wiring layer, the power line 140 is disposed so as to surround the FD line 120. Due to this arrangement, the cross-talk between the FD lines 120 can be prevented. Furthermore, the FD lines 120 are disposed at a regular pitch in the third wiring layer.

Figure 9:
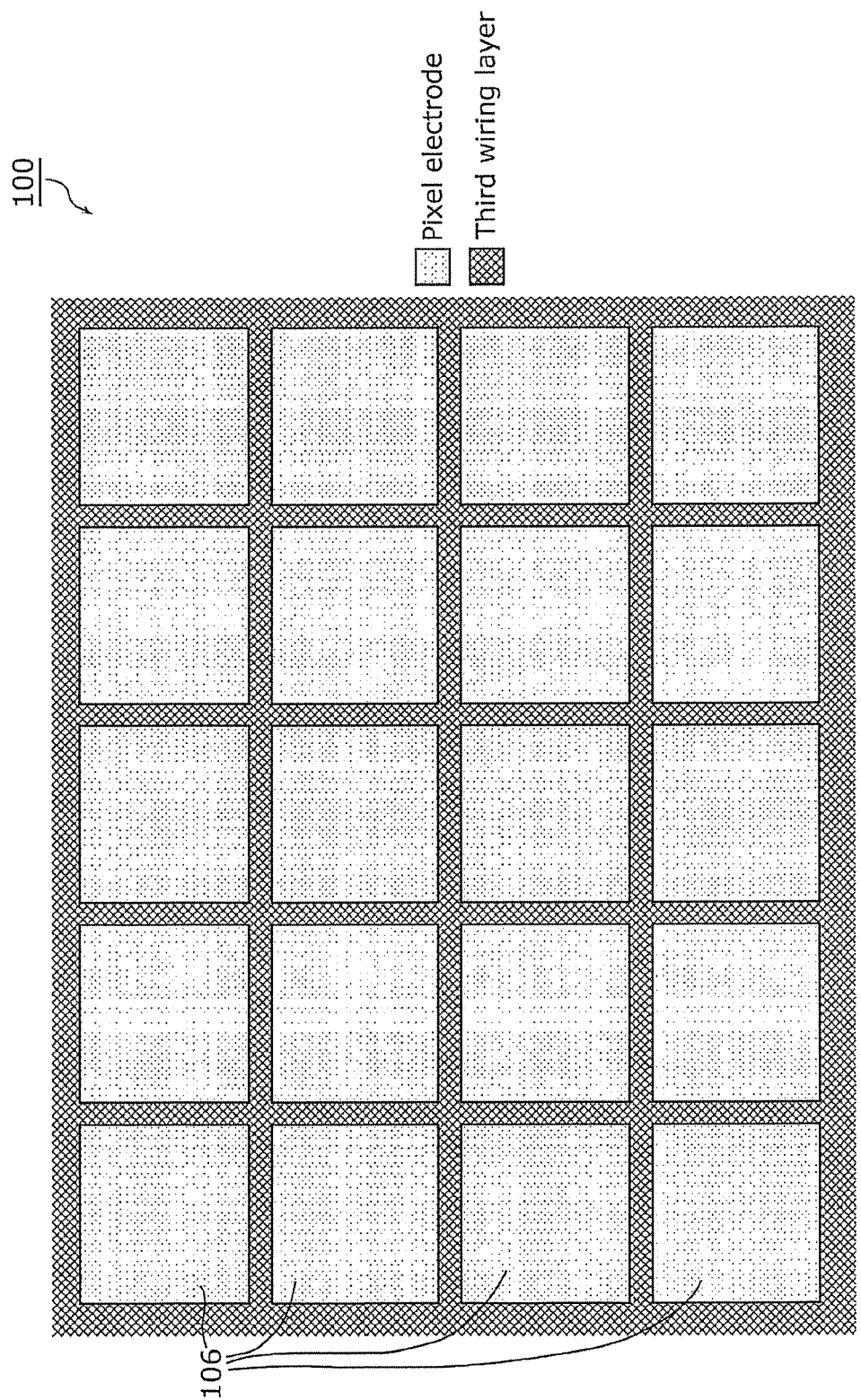
FIG. 9 illustrates a sixth planar layout of the pixel array according to Embodiment 1.

FIG. 9 illustrates a sixth planar layout of the pixel array according to Embodiment 1. In the layout of FIG. 9, the pixel electrodes 106 are added to the layout of FIG. 8.

As shown in FIG. 6 and FIG. 8, the FD line 120 occupies a large area in the first wiring layer and the third wiring layer. Furthermore, the first wiring layer is close to the gate in a stacking direction, and the third wiring layer is close to the pixel electrode 106 in the stacking direction. In other words, the third wiring layer is provided between the layer including the pixel electrodes 106 and the second wiring layer including the signal lines 121 and 122. Furthermore, the first wiring layer is provided between the layer including the gates and the second wiring layer including the signal lines 121 and 122. Based on this positional relation, the signal lines 121 and 122 are disposed on the second wiring layer which is not close to the gate and the pixel electrode 106. This prevents cross-talk caused by electrical coupling between the signal lines 121 and 122 and the gate and the pixel electrode 106 in the stacking direction.

Furthermore, as shown in FIG. 7, the FD line 120 is surrounded by the signal line connected to the same group in a stacked face direction. This prevents cross-talk caused by electrical coupling between the FD line 120 and the signal line in the stacked face direction.

With the structure of the pixel array 100 according to Embodiment 1, simultaneous read-out of two signal lines can be achieved while preventing cross-talk between the signal line and the electrode and the line in the pixel. Accordingly, the reading speed can be at least doubled, and it is possible to increase the frame rate even when the number of pixels to be read out increases due to a reduction of pixel pitch for increasing the number of pixels.

Figure 10:
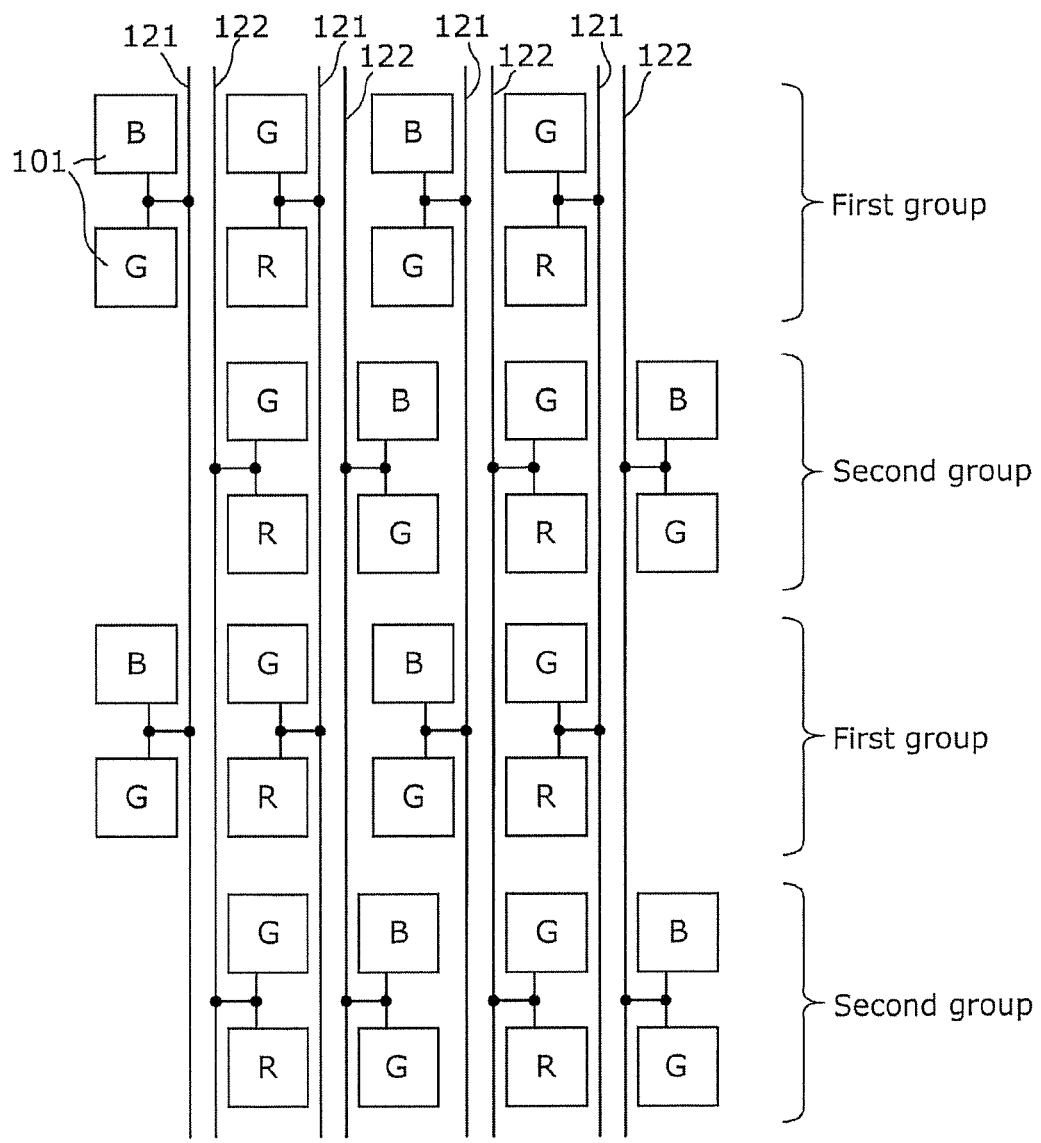
FIG. 10 illustrates a block diagram of the structure of the pixel array according to Embodiment 1.

FIG. 10 illustrates a block diagram of the structure of the pixel array according to Embodiment 1. In the Bayer arrangement shown in FIG. 10, the pixel in the first group and the pixel in the second group differ only in that whether the pixel is connected to the signal line 121 or the signal line 122. Accordingly, the pixel in the first group and the pixel in the second group have a symmetric structure when viewed from the normal direction of the stacked surface, and thus it is possible to avoid differences in characteristics.

Embodiment 2

A solid-state imaging device according to Embodiment 2 is described in terms of differences in structure and operation between Embodiment 1 and Embodiment 2.

Figure 11:
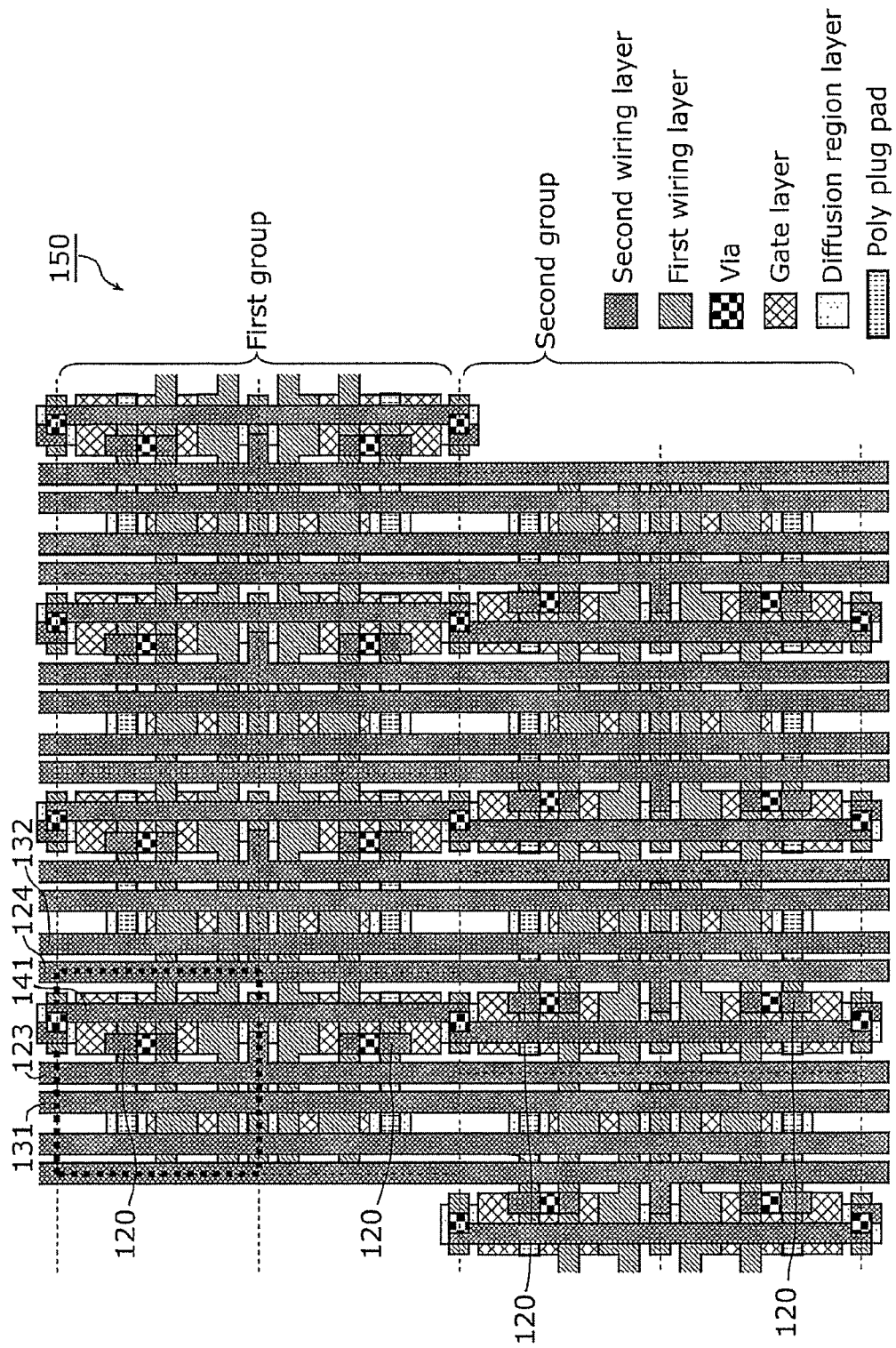
FIG. 11 illustrates a planar layout of a pixel array according to Embodiment 2.
Figure 12:
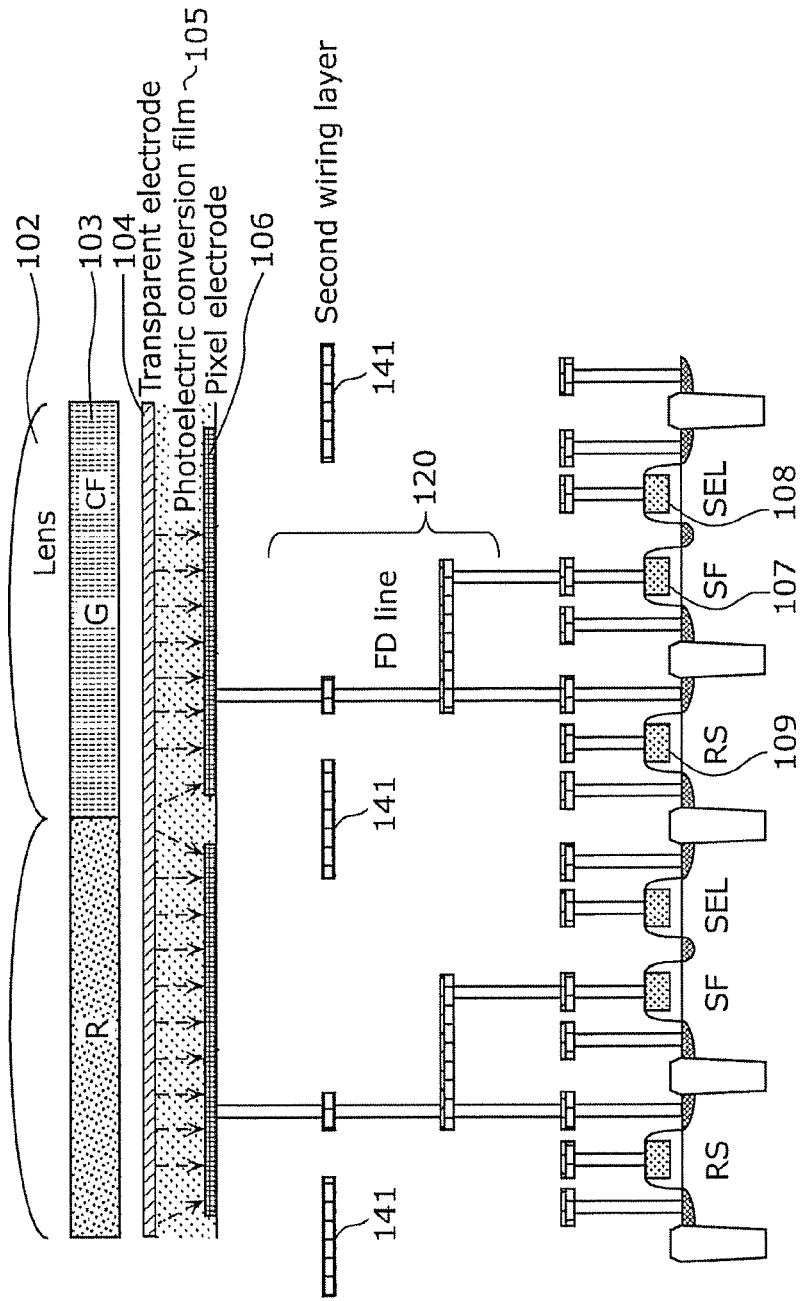
FIG. 12 illustrates a sectional view of the pixel array in the solid-state imaging device according to Embodiment 2.

FIG. 11 illustrates a planar layout of a pixel array according to Embodiment 2. Furthermore, FIG. 12 illustrates a sectional view of the pixel array in the solid-state imaging device according to Embodiment 2. In the layout of FIG. 11, a second wiring layer and vias connecting the second wiring layer and a third wiring layer are added onto a gate layer and a diffusion region layer of transistors, poly plug pads, vias, and a first wiring layer. As shown in FIG. 11, signal lines 123 and 124, reset voltage lines 131 and 132, and a power line 141 are longitudinally disposed in the second wiring layer. The layout of Embodiment 2 in FIG. 11 differs in the position of the signal lines 123 and 124 and the power line 141 from the layout of Embodiment 1 in FIG. 7. The pixel array 150 according to Embodiment 2 prevents cross-talk between the signal lines 123 and 124 and the FD line 120 by disposing the power line 141 in the second wiring layer, instead of surrounding the FD line 120 with the signal line 123 or 124. In other words, the power line 141 serves as a first shield line disposed between the FD line 120 in the pixel 101 belonging to the first group and the signal line 124, and also serves as a second shield line disposed between the FD line 120 in the pixel 101 belonging to the second group and the signal line 123. Furthermore, the power line 141 is shared between the first group and the second group. In this way, the line layout in the pixel array 150 is simplified.

With the foregoing structure, simultaneous read-out of two signal lines 123 and 124 can be achieved while preventing cross-talk between the signal lines 123 and 124 and the FD line 120, the pixel electrode 106, and the gate layer.

Furthermore, in Embodiment 2, the pixel in the first group and the pixel in the second group have a symmetric structure as shown in FIG. 10, and thus there is no difference in characteristics. Furthermore, in Embodiment 2, the power line 141 is disposed in the second wiring layer. Accordingly, a voltage of a line surrounding the FD line 120 in the third wiring layer can be set to any value. In this way, for example, when the voltage of the line surrounding the FD line 120 is set to a high voltage, the electrical flux line from the transparent electrode 104 easily extend toward the pixel electrode 106 due to the repulsion against the surrounding line immediately under the pixel electrode 106, thereby preventing cross-talk in the photoelectric conversion film 105.

As described above, the solid-state imaging device disclosed herein have been described based on Embodiments 1 and 2, but is not limited to Embodiments 1 and 2. Those skilled in the art will be readily appreciated that various modifications and combinations of the structural elements are possible in the exemplary embodiments without departing from the scope of the present disclosure. Such modifications and combinations are also embodiments of the present disclosure. For example, an imaging device (a camera) in which the solid-state imaging device according to the present disclosure is embedded is also included in the present disclosure.

Figure 13:
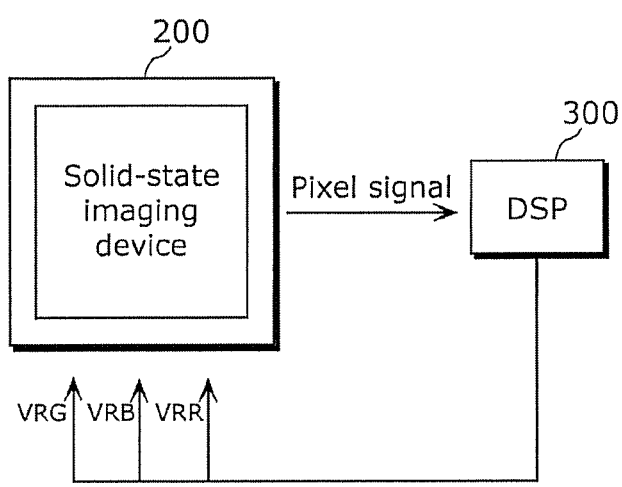
FIG. 13 illustrates a functional block diagram of an imaging device including the solid-state imaging device according to Embodiment 1 or Embodiment 2.

FIG. 13 illustrates a function block diagram of an imaging device including the solid-state imaging device according to Embodiment 1 or Embodiment 2. The imaging device shown in FIG. 13 includes the solid-state imaging device 200 according to Embodiment 1 or Embodiment 2, and a DSP 300.

The solid-state imaging device 200 includes: the pixel array 100 described in Embodiment 1 or Embodiment 2; a vertical scan circuit for selecting a pixel 101 in the pixel array 100 on a row-by-row basis to control the reading out or resetting of the pixel; a column A/D (analog-to-digital) circuit for performing A/D conversion of a pixel signal read out from the pixel array 100; a column digital memory for storing the resultant digital pixel signal; and a horizontal scan circuit for selecting each column in the column digital memory to activate the reading out of the stored digital pixel signal.

The DSP 300 serves as a DSP (Digital Signal Processor) or the like which receives the digital pixel signal provided from the solid-state imaging device 200, and performs processing such as gamma correction, color interpolation, spatial interpolation, or automatic white balance. Furthermore, the DSP 300 also serves as a microcomputer or the like which controls the solid-state imaging device 200 according to various settings specified by a user to integrate all operations of the imaging device. The signal provided from the solid-state imaging device 200 serving as an image sensor is used in the DSP 300 to calculate optimum reset voltages (VRG, VRB, VRR), and the optimum reset voltages are fed back to the solid-state imaging device 200. The solid-state imaging device 200 and the DSP 300 may be manufactured as a single semiconductor device. Accordingly, it is possible to miniaturize an electric device including the solid-state imaging device 200.

It is to be noted that the pixel 101 of the solid-state imaging device 200 belongs to the first group or the second group on a row-by-row basis, and includes the first signal line and the second signal lines which are provided for each column. The pixel 101 belonging to the first group further includes the first selection transistor that provides, to the first signal line, the voltage provided from the amplifier transistor, and the pixel 101 belonging to the second group further includes the second selection transistor that provides, to the second signal line, the voltage provided from the amplifier transistor. The pixel array 100 further includes: the first shield line disposed between the second signal line and the FD line 120 in the pixel belonging to the first group; and the second shield line disposed between the first signal line and the FD line 120 in the pixel belonging to the second group.

The imaging device including the solid-state imaging device 200 can at least double the reading speed while preventing cross-talk caused by electrical coupling between the signal line and the FD line 120, the pixel electrode of the photoelectric conversion element, and the gate electrode. In this way, it is possible to obtain high-quality video without reducing the frame rate even when the number of pixels to be read out increases due to a reduction of pixel pitch for increasing the number of pixels.

Furthermore, the pixel array according to Embodiment 1 and Embodiment 2 may have a structure in which the diffusion region of each transistor is not shared.

Figure 14:
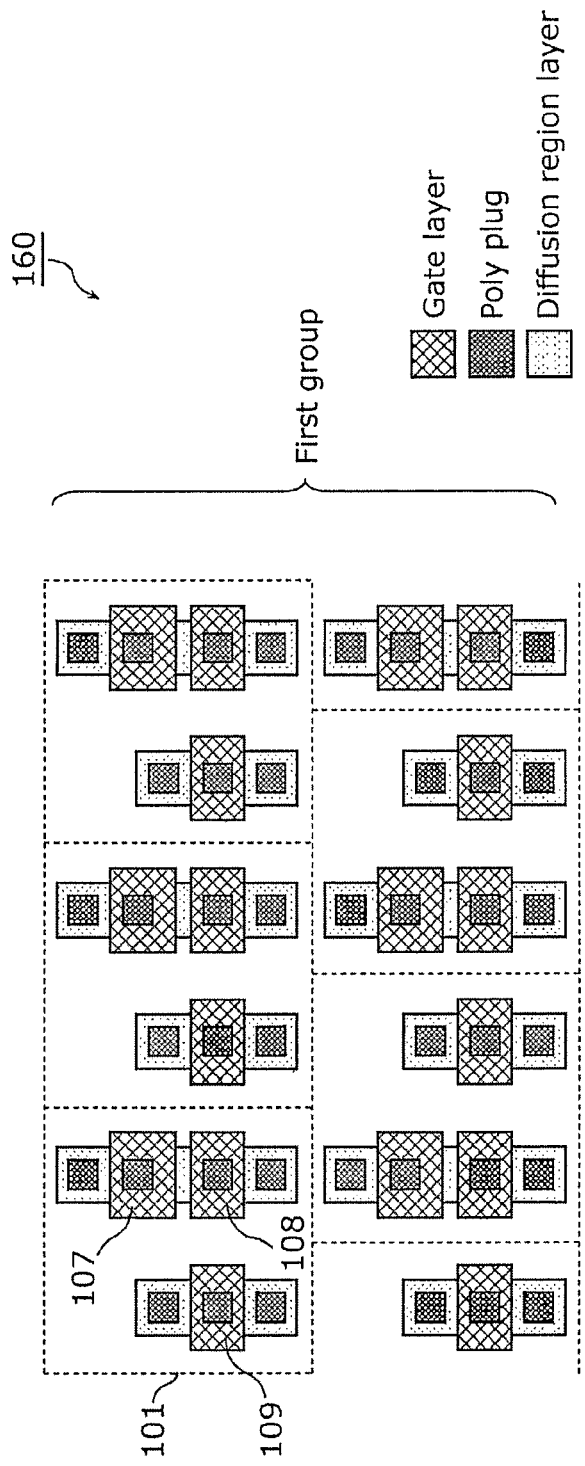
FIG. 14 illustrates a planar layout of a pixel array in which a diffusion region of each transistor is not shared.
Figure 15:
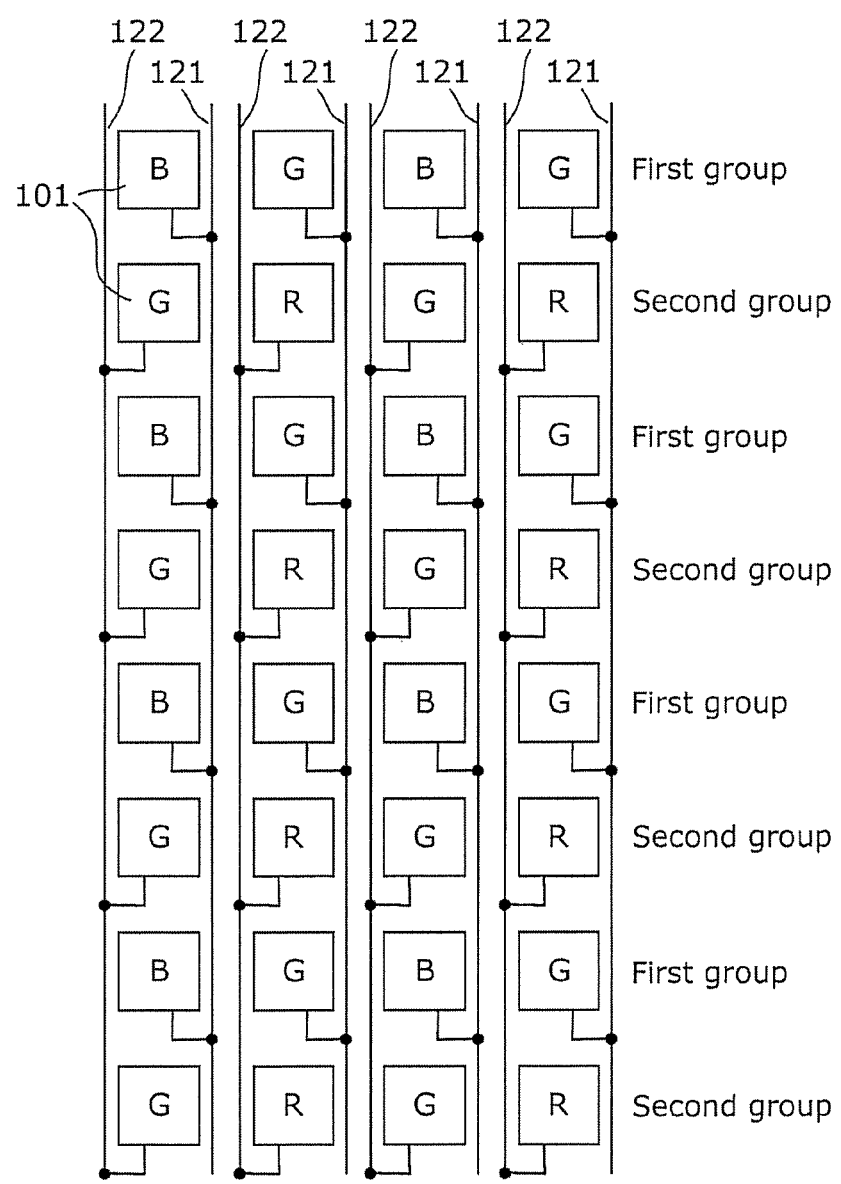
FIG. 15 illustrates a block diagram of the structure of the pixel array in which the diffusion region of each transistor is not shared.
Figure 16:
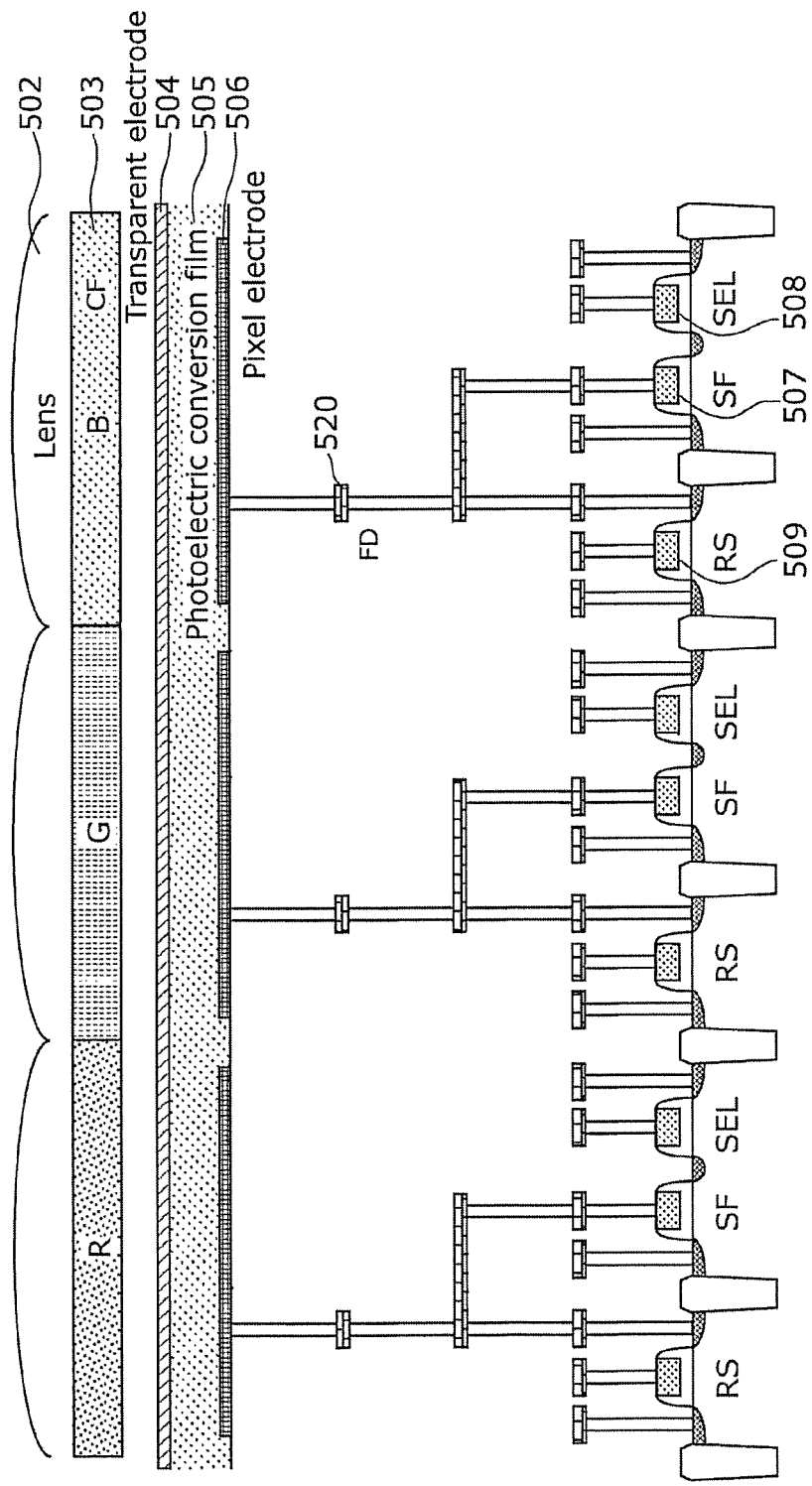
FIG. 16 illustrates a cross-sectional view of a pixel array in a solid-state imaging device including a photoelectric conversion film disclosed in PTL 1.
Figure 17:
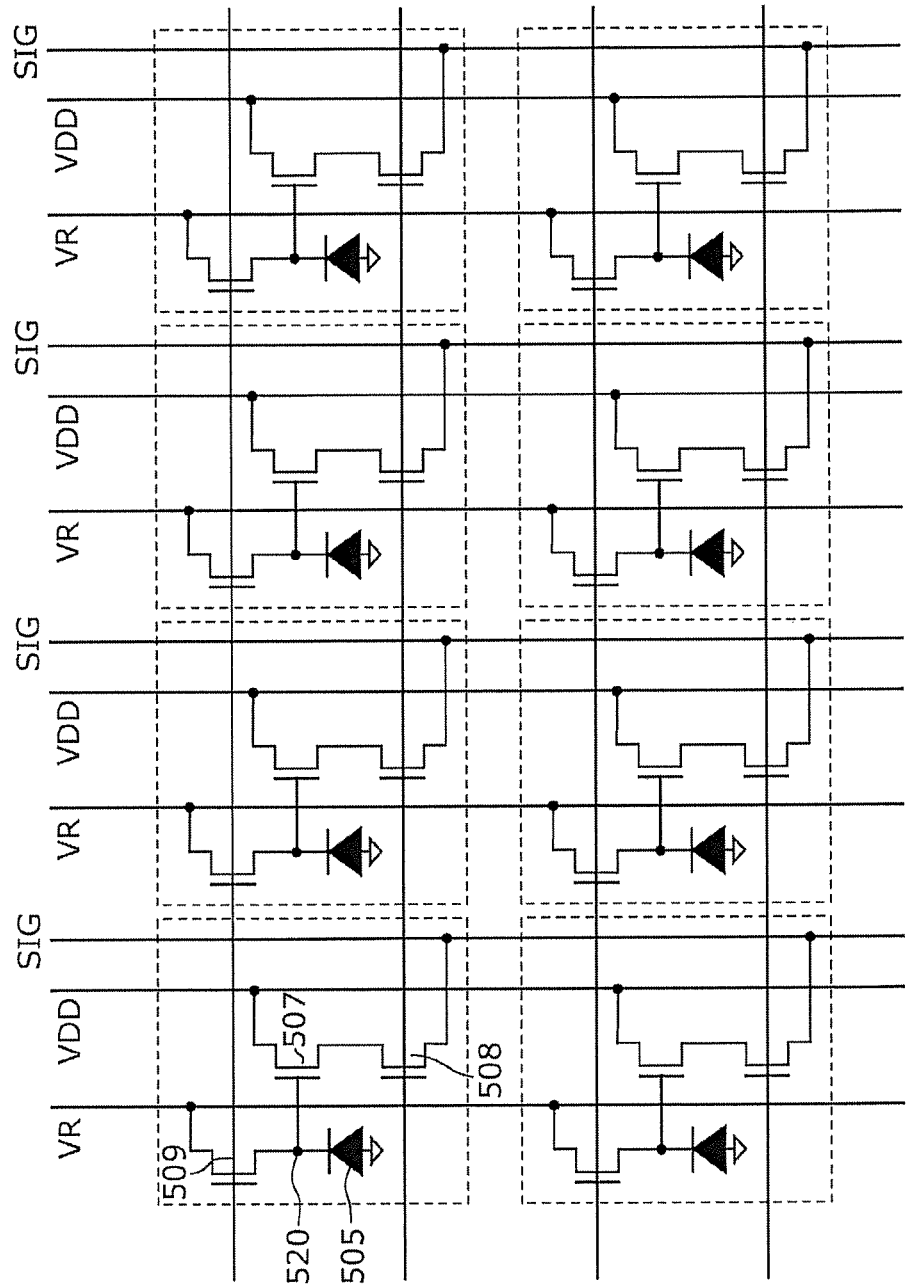
FIG. 17 illustrates a schematic circuit diagram of the pixel array disclosed in PTL 1.

FIG. 14 illustrates a planar layout of the pixel array 160 in which the diffusion region of each transistor is not shared. Furthermore, FIG. 15 illustrates a block diagram of the structure of the pixel array in which the diffusion region of each transistor is not shared. In this case, as shown in FIG. 15, data of the same color in the Bayer arrangement can be read out to the same signal line, and further the data can be provided while adding in neighbor pixels.

Furthermore, in Embodiments 1 and 2, the pixels are arranged in a matrix, but any other arrangement may be employed. For example, a honeycomb-like structure is possible.

It is to be noted that, in the solid-state imaging device according to Embodiments 1 and 2, each pixel 101 includes one photoelectric conversion element, one selection transistor, one FD line, one reset transistor, and one amplifier transistor. This means that one cell is composed of one pixel. However, the solid-state imaging device disclosed herein may have another cell structure. For example, in a unit cell, plural photoelectric conversion elements are included, and further any or all of the FD line, the reset transistor, and the amplifier transistor may be shared. This means that one cell is composed of plural pixels.

Furthermore, in Embodiments 1 and 2, an n-type MOS transistor is used as an example, but any other MOS transistor may be employed. For example, a p-type MOS transistor is possible.

The herein disclosed subject matter is to be considered descriptive and illustrative only, and the appended Claims are of a scope intended to cover and encompass not only the particular embodiments disclosed, but also equivalent structures, methods, and/or uses.

INDUSTRIAL APPLICABILITY

One or more exemplary embodiments disclosed herein are useful particularly for digital still cameras or video cameras, and suitable for use in solid-state imaging devices and cameras requiring high-quality still images and/or smooth video display.

The invention claimed is:

1. An imaging device comprising:
a pixel array including pixels arranged in columns and rows, one of the columns including a first pixel in a first row and a second pixel in a second row;
a first signal line, to which the first pixel is coupled, and a second signal line, to which the second pixel is coupled, extending in a column direction of the pixels;
a shield line, supplied with a constant voltage, extending in the column direction; and
a semiconductor substrate,
wherein the first pixel comprises:
a first photoelectric converter for converting incident light into signal charge;
a first diffusion region configured to electrically be coupled to the first photoelectric convertor, the first diffusion region being located in the semiconductor substrate and not overlapping with the second signal line in a plan view; and
a first transistor having a gate coupled to the first diffusion region,
wherein the first transistor is configured to output a signal in accordance with the signal charge, and
wherein the first diffusion region, the shield line, the first signal line, and the second signal line are arranged along a row direction of the pixels in that order.

2. The imaging device according to claim 1, wherein the shield line is a power line.

3. The imaging device according to claim 1, wherein the first signal line and the second signal line are disposed at a same height from a surface of the semiconductor substrate.

4. The imaging device according to claim 1, further comprising a plurality of wiring layers including a first wiring layer, wherein the first signal line and the second signal line are disposed in the first wiring layer.

5. The imaging device according to claim 1, wherein the first signal line, the second signal line, and the shield line are disposed at a same height from a surface of the semiconductor substrate.

6. The imaging device according to claim 1, further comprising a plurality of wiring layers including a first wiring layer,
wherein the first signal line, the second signal line, and the shield line are disposed in the first wiring layer.

7. The imaging device according to claim 1, wherein no other photoelectric convertor is included in the first pixel.

8. The imaging device according to claim 1, wherein the shield line is located above the gate of the first transistor in a plan view.

9. The imaging device according to claim 1, wherein the first pixel is coupled to the shield line.

10. The imaging device according to claim 1, wherein the first diffusion region does not overlap with the first signal line in the plan view.

11. An imaging device comprising:
a pixel array including pixels arranged in columns and rows, one of the columns including a first pixel in a first row and a second pixel in a second row;
a first signal line, to which the first pixel is coupled, and a second signal line, to which the second pixel is coupled, extending in a column direction of the pixels;
a shield line, supplied with a constant voltage, extending in the column direction; and
a semiconductor substrate,
wherein the first pixel comprises:
a first photoelectric converter for converting incident light into signal charge;
a first diffusion region configured to be electrically coupled to the first photoelectric convertor, the first diffusion region being located in the semiconductor substrate and not overlapping with the second signal line in a plan view; and a first transistor having a gate coupled to the first diffusion region, wherein the first transistor is configured to output a signal in accordance with the signal charge, wherein the first diffusion region, the first signal line, the shield line, and the second signal line are arranged along a row direction of the pixels in that order, and wherein the shield line overlaps the first photoelectric converter in a plan view.

12. The imaging device according to claim 11, wherein the shield line overlaps the gate of the first transistor in a plan view.

13. The imaging device according to claim 11, wherein the shield line is a power line.

14. The imaging device according to claim 11, wherein the first signal line and the second signal line are disposed at a same height from a surface of the semiconductor substrate.

15. The imaging device according to claim 11, further comprising a plurality of wiring layers including a first wiring layer, wherein the first signal line and the second signal line are disposed in the first wiring layer.

16. The imaging device according to claim 11, wherein the first signal line, the second signal line, and the shield line are disposed at a same height from a surface of the semiconductor substrate.

17. The imaging device according to claim 11, further comprising a plurality of wiring layers including a first wiring layer, wherein the first signal line, the second signal line, and the shield line are disposed in the first wiring layer.

18. The imaging device according to claim 11, wherein no other photoelectric convertor is included in the first pixel.

19. The imaging device according to claim 11, wherein the shield line is located above the gate of the first transistor in a plan view.

20. The imaging device according to claim 11, wherein the first pixel is coupled to the shield line.

21. The imaging device according to claim 11, wherein the first diffusion region does not overlap with the shield line in the plan view.

22. An imaging device comprising:

a pixel array including pixels arranged in columns and rows, one of the columns including a first pixel in a first row and a second pixel in a second row;

a first signal line, to which the first pixel is coupled, and a second signal line, to which the second pixel is coupled, extending in a column direction of the pixels;

a shield line, supplied with a constant voltage, extending in the column direction; and a semiconductor substrate, wherein the first pixel comprises:

a first photoelectric converter for converting incident light into signal charge;

a first diffusion region configured to be electrically coupled to the first photoelectric convertor, the first diffusion region being located in the semiconductor substrate and not overlapping with the second signal line in a plan view; and a first transistor having a gate coupled to the first diffusion region, wherein the first transistor is configured to output a signal in accordance with the signal charge, wherein the first diffusion region, the shield line, and the second signal line are arranged along a row direction of the pixels in that order, and wherein the shield line overlaps the first photoelectric converter in a plan view.

* * * * *